(12) United States Patent
O'Day

(10) Patent No.: US 8,542,040 B1
(45) Date of Patent: Sep. 24, 2013

(54) RECONFIGURABLE DIVIDER CIRCUITS WITH HYBRID STRUCTURE

(75) Inventor: Justin O'Day, Palos Park, IL (US)

(73) Assignee: Integrated Device Technology, Inc., San Jose, CA (US)

( * ) Notice: Subject to any disclaimer, the term of this patent is extended or adjusted under 35 U.S.C. 154(b) by 4 days.

(21) Appl. No.: 13/285,103

(22) Filed: Oct. 31, 2011

(51) Int. Cl.
*H03B 19/00* (2006.01)

(52) U.S. Cl.
USPC ............................. 327/117; 327/115; 377/47

(58) Field of Classification Search
USPC ...................... 327/115, 117, 118; 377/47, 48
See application file for complete search history.

(56) References Cited

U.S. PATENT DOCUMENTS

| | | | | |
|---|---|---|---|---|
| 5,451,912 A | * | 9/1995 | Torode | 331/108 C |
| 5,757,807 A | * | 5/1998 | Tezuka et al. | 370/541 |
| 6,707,326 B1 | * | 3/2004 | Magoon et al. | 327/115 |
| 6,741,109 B1 | * | 5/2004 | Huang et al. | 327/156 |
| 7,042,973 B2 | * | 5/2006 | Kuroki | 377/47 |
| 7,924,072 B2 | * | 4/2011 | Palmer et al. | 327/156 |

\* cited by examiner

*Primary Examiner* — William Hernandez
(74) *Attorney, Agent, or Firm* — Myers, Bigel et al

(57) ABSTRACT

An integrated circuit includes a first variable divider circuit configured to receive a clock signal and to apply a lower range of integer division factors thereto responsive to a first control input to generate a first divided clock signal and a second variable divider circuit configured to receive the clock signal and to apply an upper range of integer division factors thereto responsive to a second control input to generate a second divided clock signal. The integrated circuit further includes a multiplexer circuit configured to selectively pass the first and second divided clock signals responsive to a third control input.

19 Claims, 6 Drawing Sheets

US 8,542,040 B1

RECONFIGURABLE DIVIDER CIRCUITS WITH HYBRID STRUCTURE

FIELD

The inventive subject matter relates to integrated circuits and, more particularly, to divider circuits.

BACKGROUND

Divider circuits are commonly used in integrated circuit devices to provide clock signals having a desired frequency. For example, a typical phase-locked loop (PLL) circuit may include a variable input divider that receives a clock signal from a crystal oscillator and divides the signal produced by the crystal oscillator down to generate a reference signal for a phase/frequency detector (PFD) of the forward path of the PLL. The output of the PLL may also be passed through a variable divider circuit and feedback circuitry of the PLL may also include a divider circuit. Divider circuits are also commonly used in clock distribution and other circuitry.

In many applications, it may be desirable to provide a variable divider that is controllable to provide variable division. It is generally desirable that such a variable divider be able to operate from a relatively high frequency input clock signal to allow the divider circuit to provide relatively high output resolution. However, maintaining high resolution while providing a large division factor range may be difficult.

SUMMARY

Some embodiments provide an integrated circuit including a first variable divider circuit configured to receive a clock signal and to apply a lower range of integer division factors thereto responsive to a first control input to generate a first divided clock signal and a second variable divider circuit configured to receive the clock signal and to apply an upper range of integer division factors thereto responsive to a second control input to generate a second divided clock signal. The integrated circuit further includes a multiplexer circuit configured to selectively pass the first and second divided clock signals responsive to a third control input.

In some embodiments, the second variable divider circuit may include a plurality of groups of cascade-connected flip-flops having clock inputs that receive the clock signal. The second variable divider circuit may include a plurality of first multiplexer circuits, respective ones of which have inputs coupled to outputs of flip-flops of respective ones of the groups of flip-flops and configured to selectively pass signals therefrom to a data input of another one of the groups of flip-flops, a second multiplexer circuit coupled to an outputs of a last one of the groups of flip-flops and configured to selectively pass signals therefrom to output a divided clock signal and a feedback circuit having an input coupled to the second multiplexer and an output coupled to a first one of the groups of flip-flops. The groups of flip-flops may have different numbers of flip-flops and the first and second multiplexer circuits may be controllable to provide variable length flip-flop chains. For each group of flip-flops, a first multiplexer circuit may be configured to bypass no flip-flops of the group in a first state and to bypass all but one flip-flop of the group in a second state. The groups of flip-flops and the first and second multiplexer circuits may be arranged such that the flip-flop chains do not include any more than one multiplexer circuit between any two consecutive flip-flops.

The feedback circuit may be configured to support even and odd integer division. The feedback circuit may include, for example, first and second cascade connected flip-flops, an input of the first flip-flop coupled to an output of the second multiplexer circuit. The feedback circuit may include a third multiplexer circuit having a first input coupled to an output of the first multiplexer circuit and a second input coupled to a logic level node, and a NAND circuit having a first input coupled to an output of the third multiplexer circuit, a second input coupled to an output of the second flip-flop and an output coupled to an input of the first one of the groups of flip-flops.

In some embodiments, the first variable divider circuit may include a chain of cascade-connected flip-flops and a multiplexer circuit configured to selectively couple outputs of the flip-flops of the chain to an input of the chain. The integrated circuit may further include at least one duty cycle correction circuit coupled to outputs of the first and second variable divider circuits.

Further embodiments of the inventive subject matter provide a variable divider circuit including a plurality of groups of cascade-connected flip-flops having clock inputs that receive a clock signal, a plurality of first multiplexer circuits, respective ones of which are coupled to outputs of flip-flops of respective ones of the groups of cascaded flip-flops and configured to selectively pass signals therefrom to a data input of another one of the groups of flip-flops, a second multiplexer circuit coupled to a last one of the groups of flip-flops and configured to selectively pass signals therefrom to output a divided clock signal, and a feedback circuit having an input coupled to the second multiplexer circuit and an output coupled to a first one of the groups of flip-flops. The groups of flip-flops may have different numbers of flip-flops and the first and second multiplexer circuits may be controllable to provide variable length flip-flop chains.

Additional embodiments provide an integrated circuit including a first variable divider circuit including a series of cascade-connected flip-flops having clock inputs that receive a clock signal and a first multiplexer circuit configured to selectively couple outputs of the flip-flops of the series to an input of the series of flip-flops to generate a first divided clock signal at an output of the series of flip-flops. The integrated circuit also includes a second variable divider circuit including a plurality of groups of cascade-connected flip-flops having clock inputs that receive the clock signal, a plurality of second multiplexer circuits, respective ones of which are coupled to outputs of flip-flops of respective ones of the groups of cascaded flip-flops and configured to selectively pass signals therefrom to a data input of another one of the groups of flip-flops, a third multiplexer circuit coupled to an outputs of a last one of the groups of flip-flops and configured to selectively pass signals therefrom to produce a second divided clock signal and a feedback circuit having an input coupled to the third multiplexer and an output coupled to a first one of the group of flip-flops. The integrated circuit also includes a fourth multiplexer circuit configured to selectively pass the first and second divided clock signals responsive to a third control input.

BRIEF DESCRIPTION OF THE DRAWINGS

The accompanying drawings, which are included to provide a further understanding of the inventive subject matter and are incorporated in and constitute a part of this application, illustrate certain embodiment(s) of the inventive subject matter. In the drawings.

DETAILED DESCRIPTION

Figure 1:
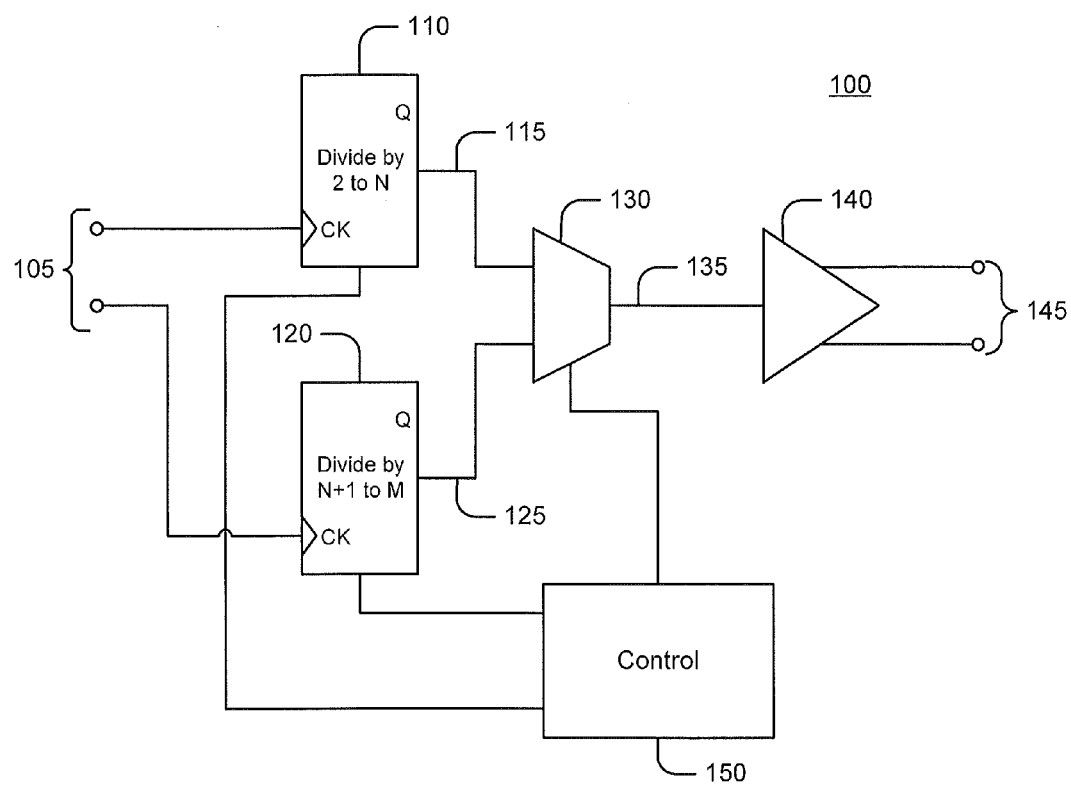
FIG. 1 illustrates a divider circuit according to some embodiments of the inventive subject matter.

Embodiments of the present inventive subject matter now will be described more fully hereinafter with reference to the accompanying drawings, in which embodiments of the inventive subject matter are shown. This inventive subject matter may, however, be embodied in many different forms and should not be construed as limited to the embodiments set forth herein. Rather, these embodiments are provided so that this disclosure will be thorough and complete, and will fully convey the scope of the inventive subject matter to those skilled in the art. Like numbers refer to like items throughout.

It will be understood that, although the terms first, second, etc. may be used herein to describe various items, these items should not be limited by these terms. These terms are only used to distinguish one item from another. For example, a first item could be termed a second item, and, similarly, a second item could be termed a first item, without departing from the scope of the present inventive subject matter. As used herein, the term "and/or" includes any and all combinations of one or more of the associated listed items.

It will be understood that when an item is referred to as being "connected" or "coupled" to another item, it can be directly connected or coupled to the other item or intervening items may be present. In contrast, when an item is referred to as being "directly connected" or "directly coupled" to another item, there are no intervening items present. Throughout the specification, like reference numerals in the drawings denote like items.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

Some embodiments of the inventive subject matter arise from a realization that a high-speed variable divider may be implemented by using different divider circuit topologies for different integer division factor ranges so that a desirable combination of circuit size and high divider resolution may be achieved. In some embodiments, for example, a lower division factor range may be provide by a first variable divider circuit that uses a relatively low number of flip-flops interconnected by a multiplexer, while an upper division factor range may be provided by a second variable divider that uses a flip-flop chain with a reduced or minimized number of multiplexers. In this manner, a relatively high frequency input clock can be used and relatively high resolution obtained in a reasonably small footprint.

FIG. 1 illustrates a divider circuit 100 according to some embodiments of the inventive subject matter. The divider circuit 100 includes first and second variable divider circuits 110, 120, which are configured to receive an input clock signal 105. The clock signal 105 may be provided, for example, via a clock distribution tree. The first and second variable divider circuits 110,120 provide variable integer division of the input clock signal 105 over respective first and second ranges 2-N and N+1 to M of integer division factors responsive to control inputs provided thereto. Divided clock signals 115, 125 produced by the variable divider circuits 110, 120 are applied to first and second inputs of a multiplexer 130. The multiplexer 130 produces an output signal 130 corresponding to one of the first and second divided clock signals 115, 125 selected responsive to a control signal provided to the multiplexer 130. The output signal 130 may be applied to a driver circuit 140, which produces differential clock signals 145. A control circuit 150 provides the control signals to each of the first and second variable dividers 110, 120 and the multiplexer 130, such that variable integer division may be applied to the input clock signal.

It will be appreciated that the divider circuit 100 generally may be implemented as a component of an integrated circuit (IC) device, such as clock generator IC. Although FIG. 1 illustrates a divider circuit with two multiplexed variable dividers, other embodiments may utilize three or more multiplexed variable dividers. In addition, although FIG. 1 illustrates first and second variable divider circuits 110, 120 with contiguous division factor ranges, it will be understood that, in some embodiments, the multiplexed divider circuits along the lines illustrated in FIG. 1 may provide non-contiguous division factor ranges. It will also be appreciated that single-ended to differential signal conversion may be achieved in a manner different than that illustrated in FIG. 1. For example, the variable divider circuits 110, 120 may be configured to generate differential output signal pairs, and the multiplexer 130 may be configured to multiplex these differential signal pairs to produce a single differential output signal pair.

Figure 2:
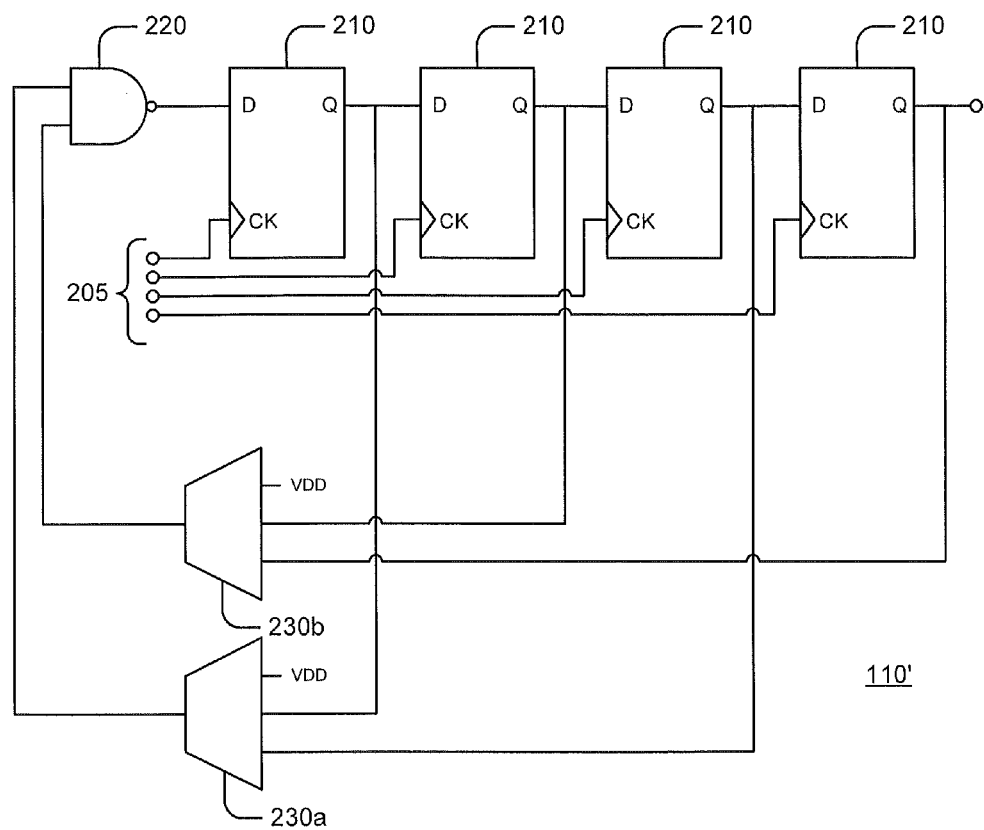
FIGS. 2 and 3 illustrate variable divider circuits that may be utilized in the divider circuit of FIG. 1.

FIG. 2 illustrates a variable divider circuit 110' that may be used in the first, lower-range variable divider circuit 110 of FIG. 1. The variable divider circuit 110' includes a chain of cascade connected flip-flops 210, wherein a data output terminal Q of one flip-flop 210 is connected to a data input D of a succeeding flip-flop 210 of the chain. The flip-flops 210 receive a common clock signal 205, which may be distributed by a clock tree. First and second multiplexers 230a, 230b receive pairs of output signals generated by the flip-flops 210. In particular, the first multiplexer 230a receives the output signals from the first and third stages of the flip-flop chain, while the second multiplexer 230b receives the output signals from the second and fourth stages of the flip-flop chain. The first and second multiplexers 230a, 230b also each receive a fixed "high" logic level signal VDD. The outputs of the first and second multiplexers 230a, 230b are provided to a NAND circuit 220, which produces an output signal that is applied to the data input D of the first flip-flop 210. It will be appreciated that the NAND circuit 220 may be implemented using a variety of different circuit configurations (e.g., a variety of Boolean equivalent logic circuits). In the illustrated example, control signals applied to the multiplexers 230a, 230b enable configuration of the variable divider circuit 110' to provide integer division factors over a range from 2 to 8. It will be appreciated that a similar architecture may be used to support other division factor ranges.

Figure 3:
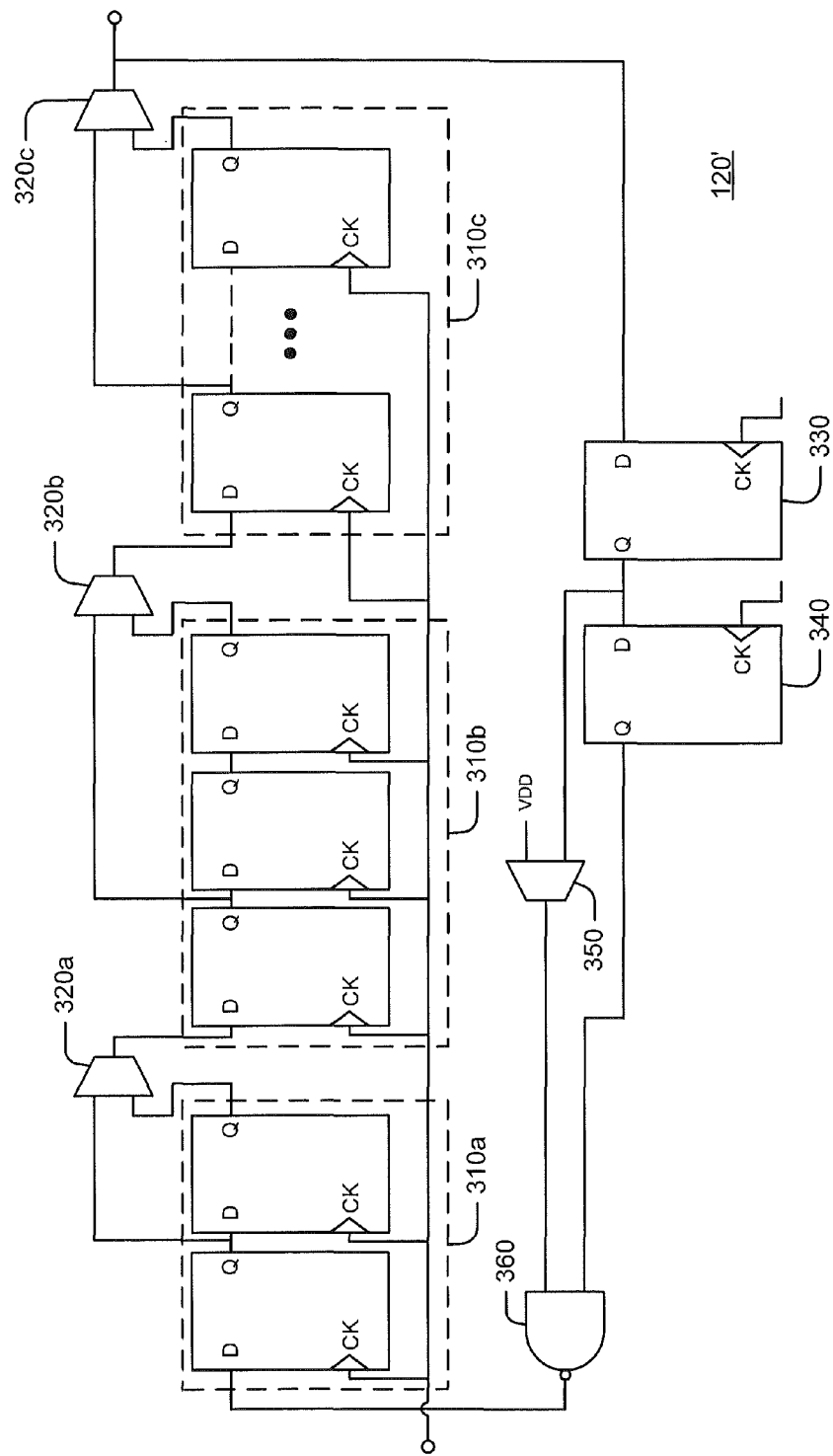

FIG. 3 illustrates a variable divider circuit 120' that may be used as the second, higher-range variable divider circuit 120 of FIG. 1. The variable divider circuit 120' includes a plurality of groups 310a, 310b, 310c of cascade-connected flip-flops, clocked by a common clock signal. The groups 310a, 310b, 310c include different numbers of flip-flops, increasing from the first group 310a through the third group 310c. First multiplexers 320a, 320b receive output signals from first and last flip-flops of respective ones of the first and second groups 310a. The outputs of the first multiplexers 320a, 320b are provided to data inputs D of the first flip-flops of the second and third groups 310b, 310c. A second multiplexer 320c receives output signals from the first flip-flop of the third group 310c and from the last flip-flop of the third group 310c, and produces the output of the variable divider circuit 120'. The first and second multiplexers 320a, 320b are configured to selectively bypass none or all but one of the flip-flops in the respective ones of the groups 310a, 310b, 310c.

The output of the second multiplexer 320c is also provided to a feedback circuit including first and second cascaded flip-flops 330, 340, a third multiplexer 350 and a NAND circuit 360. The third multiplexer 350 receives the output of the first flip-flop 330 and a fixed "high" logic signal VDD. The output of the third multiplexer 350 is provided to a first input of the NAND circuit 360, while a second input of the NAND circuit 360 receives the output of the second flip-flop 340.

In the illustrated example, control signals applied to the first, second and third multiplexers 320a, 320b, 320c, 350 may be used to implement integer division over a range of from 9 to 24. More particularly, the flip-flop groups 310a, 310b, 310c, the multiplexers 320a, 320b, 320c and the feedback circuit are arranged to produce variable length flip-flop chains such that, for any given integer division factor, each flip-flop in the chain is separated from the next flip-flop in the chain by no more than one multiplexer. This can reduce or minimize the delay introduced by the intervening circuitry and thus enable the divider circuit 120' to operate at a relatively high input clock frequency for the range of division factors. This can supports higher resolution than, for example, an architecture along the lines illustrated in FIG. 2. In some embodiments, a divider with an architecture along the lines of FIG. 3 can be used for an upper division factor range in combination with a divider circuit, such as that illustrated in FIG. 2, that covers a lower division factor range but occupies less circuit area. In this manner, a desirable combination of circuit size, range and resolution may be obtained. Although the divider configuration illustrated in FIG. 3 may be used in combination with a divider having the configuration of FIG. 2, it will be understood that, in some embodiments, a divider along the lines of FIG. 3 may similarly be used in combination with a divider circuit having an arrangement other than that shown in FIG. 2.

Divided clock signals produced by variable clock divider circuits along the lines discussed above with reference to FIGS. 2 and 3 generally may have an asymmetrical (other than 50%) duty cycle which, in some applications, may be undesirable. According to further embodiments of the inventive subject matter, a selectable duty cycle correction circuit may be used to generate an approximately 50% duty cycle clock signal from such asymmetrical duty cycle clock signals.

Figure 4:
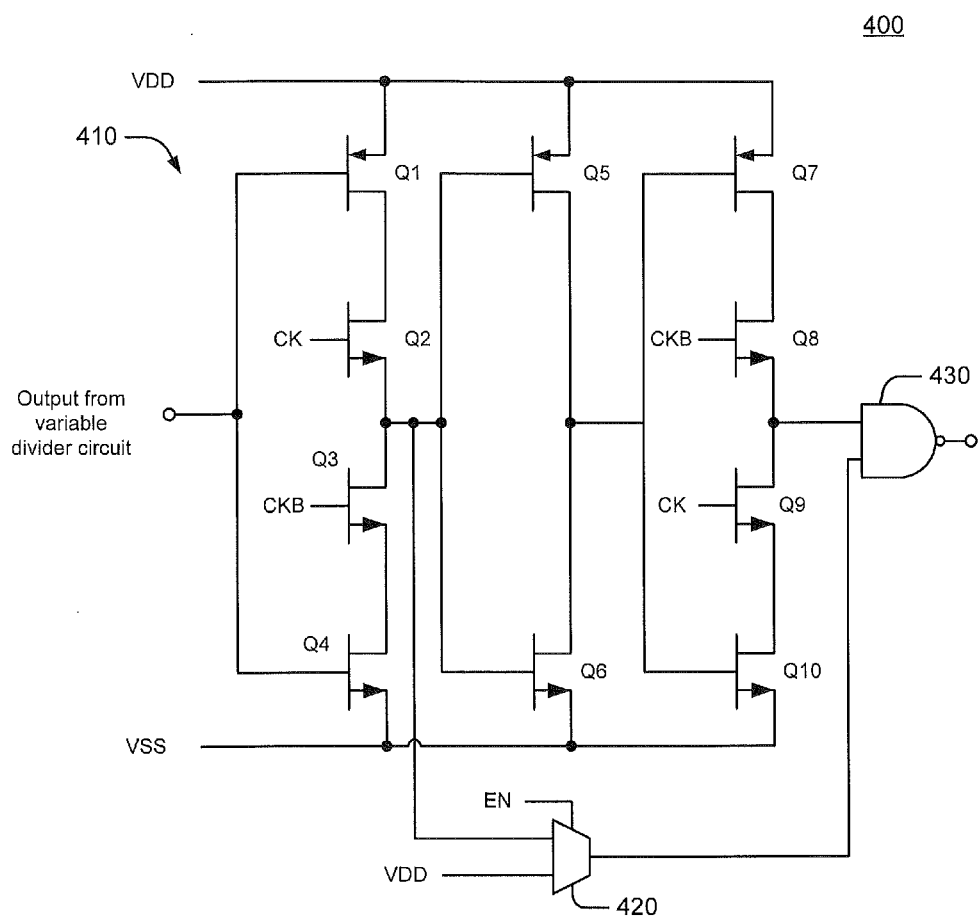
FIG. 4 illustrates a duty cycle correction circuit according to some embodiments of the inventive subject matter.

FIG. 4 illustrates an example of a duty cycle correction circuit 400 according to some embodiments. The duty cycle correction circuit 400 includes a flip-flop circuit 410 comprising transistors Q1, Q2, . . . , Q10. An input clock signal, e.g., an asymmetrical duty cycle clock signal produced by a variable divider circuit along the lines of FIG. 2 and/or FIG. 3, is applied to transistors Q1 and Q4. Differential clock inputs CK, CKB are applied to transistors Q8 and Q9. The output of the flip-flop circuit 410 is applied to a first input of a NAND circuit 430. A second input of the NAND circuit 430 is coupled to an output of a multiplexer 420 that receives input signals from an internal node of the flip-flop circuit 410 and a fixed high level logic node VDD. An enable signal EN applied to the multiplexer 420 may be used to selectively apply duty cycle correction.

Referring again to FIG. 1, duty cycle correction circuits along the lines illustrated in FIG. 4 may be incorporated at the outputs of each of the variable divider circuit 110, 120 of FIG. 1, such that the divided clock signals provided to the multiplexer 130 are duty cycle corrected before passage to the multiplexer 130. Alternatively, a single duty cycle correction circuit may be placed at the output of the multiplexer 130 or downstream therefrom.

Figure 5:
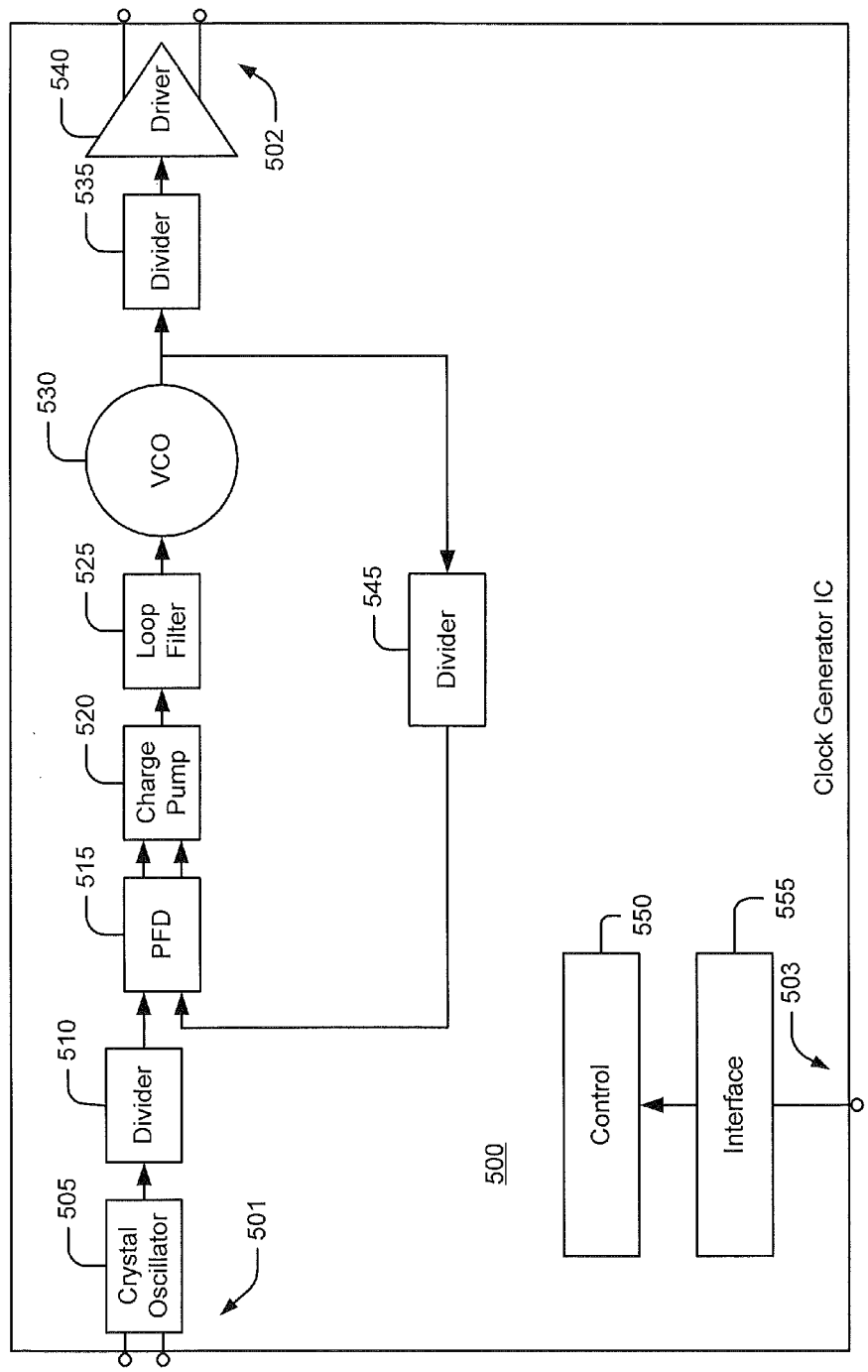
FIG. 5 illustrates a clock generator integrated circuit chip employing variable divider circuits according to some embodiments of the inventive subject matter.

As noted above, variable divider circuits according to embodiments of the inventive subject matter may be used in any of a number of different applications. FIG. 5 illustrates an example in the form of a clock generator integrated circuit chip 500 employing divider circuits according to some embodiments. The chip 500 includes a first external port 501 configured to be coupled to an external crystal resonator. A crystal oscillator circuit 505 is coupled to the input 501 and is configured interoperate with the external crystal resonator to generate an oscillating output signal. An input divider circuit 510 is configured to receive the oscillator signal and to provide a frequency division thereto, thus producing a frequency reference signal for a PFD circuit 515 of a PLL.

The PFD circuit 515 responsively controls a charge pump circuit 520, which generates an input to a loop filter circuit 525. A VCO circuit 530 receives the output of the loop filter circuit 525 and generates an oscillating output signal having a frequency that depends on the output of the loop filter circuit 525. The output of the VCO 530 is provided to an output divider 535. A divided down signal produced by the output divider 535 is applied to a driver circuit 540, which is configured to provide a clock signal to an external recipient coupled to a second external port 502. The output of the VCO circuit 530 of the PLL is also provided to a feedback divider circuit 545, which produces the feedback signal that is applied to the PFD circuit 515 of the PLL.

In some embodiments, any or all of the divider circuits 510, 535 and 545 may be implemented using variable divider circuits along the lines discussed above with reference to FIGS. 1-4. This allows the chip 500 to be user configurable to suit a particular application, e.g., a particular desired output frequency and/or crystal oscillator reference frequency. The chip 500 may, for example, include a control circuit 550 externally accessed via a communications interface circuit 555 (e.g., an I²C interface circuit) coupled to a third external port 503. The control circuit 550 may be used, for example, to control division factors applied by the dividers 510, 535 and 545 such that a user can program the chip 500 to produce a clock signal having a desired frequency and/or other characteristics.

The description of the device of FIG. 5 is provided for purposes of illustration of an example of an application of divider circuits according to embodiments of the inventive subject matter. It will be appreciated that divider circuits according to embodiments of the inventive subject matter are useable in any of a wide variety of other applications.

Figure 6:
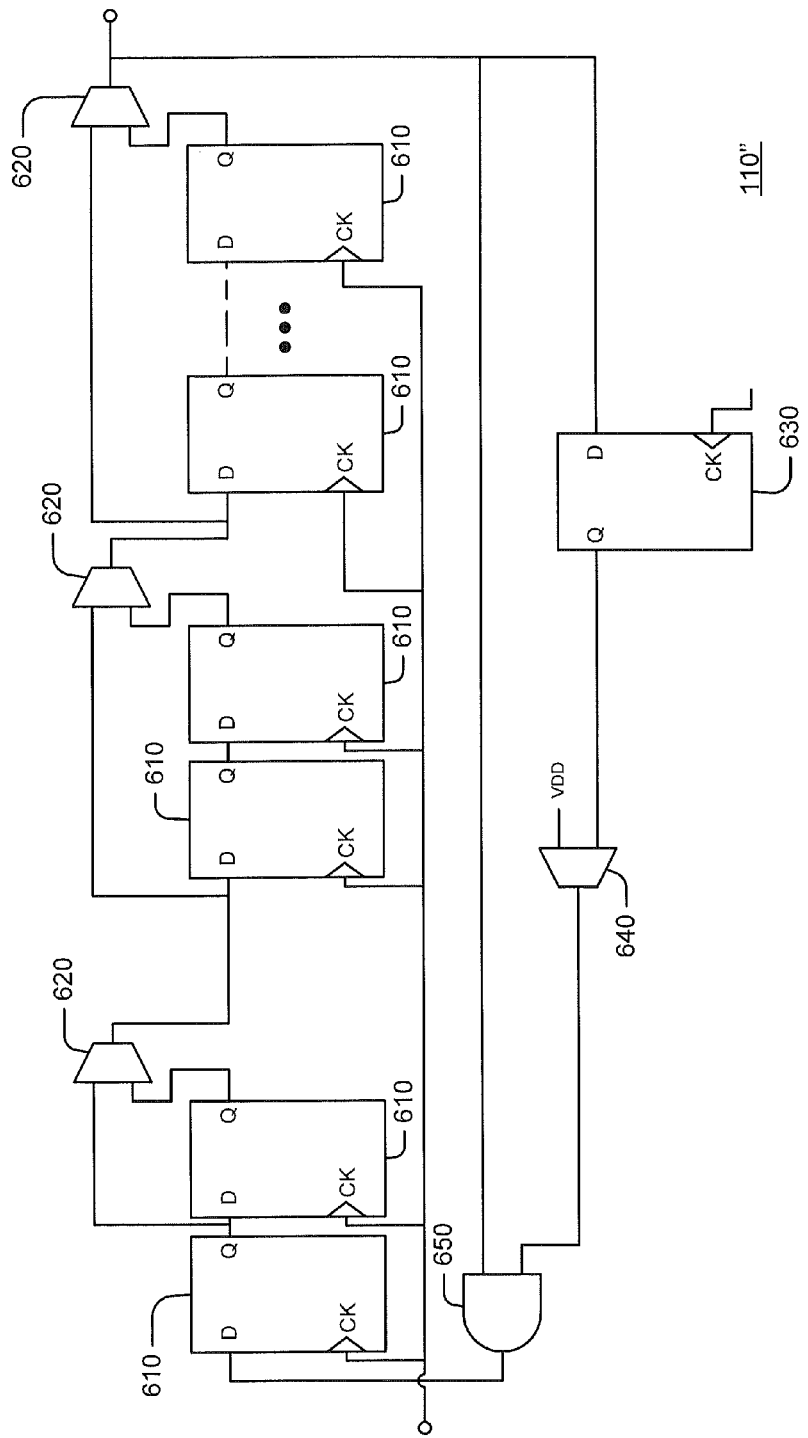
FIG. 6 illustrates a variable divider circuit that may be utilized in the divider circuit of FIG. 1.

As noted above with reference to FIG. 1, a number of different configurations may be used for the first and second variable divider circuits 110, 120 shown therein. FIG. 6 illustrates a variable divider circuit 110" which may be used, for example, in the variable divider circuit 110 of FIG. 1. The variable divider circuit 110" includes a plurality of groups of flip-flops 610 interconnected by multiplexers 620. An output signal of a last one of the multiplexers 620 is provided to a feedback circuit including a flip-flop 630, a multiplexer 640 and an AND gate 660. In the instant example, the division factor provided by the variable divider circuit 110" may be 2 to 17, selected by appropriate inputs to the multiplexers 620, 640. Unlike the circuitry of FIG. 3, all of the flip-flops 610 of a given group may be bypassed by multiplexers 620 such that, depending on the states of the multiplexers 620, adjacent flip-flops 610 in a chain may be separated by more than one of the multiplexers 620. This can limit the clock speed that the divider circuit 110" may support in comparison, for example, to the configuration of FIG. 3. However, such an arrangement could be used in a lower range divider in place of, for example, the circuit configuration illustrated in FIG. 2. It will be further appreciated that other divider arrangements may be used.

In the drawings and specification, there have been disclosed typical embodiments of the inventive subject matter and, although specific terms are employed, they are used in a generic and descriptive sense only and not for purposes of limitation, the scope of the inventive subject matter being set forth in the following claims.

What is claimed is:

1. An integrated circuit comprising:
a first variable divider circuit configured to receive a clock signal and to apply a lower range of integer division factors thereto responsive to a first control input to generate a first divided clock signal;
a second variable divider circuit configured to receive the clock signal and to apply an upper range of integer division factors thereto responsive to a second control input to generate a second divided clock signal; and
a multiplexer circuit configured to selectively pass the first and second divided clock signals responsive to a third control input.

2. An integrated circuit comprising:
a first variable divider circuit configured to receive a clock signal and to apply a lower range of integer division factors thereto responsive to a first control input to generate a first divided clock signal;
a second variable divider circuit configured to receive the clock signal and to apply an upper range of integer division factors thereto responsive to a second control input to generate a second divided clock signal, wherein the second variable divider circuit comprises:
a plurality of groups of cascade-connected flip-flops having clock inputs that receive the clock signal;
a plurality of first multiplexer circuits, respective ones of which have inputs coupled to outputs of flip-flops of respective ones of the groups of flip-flops and configured to selectively pass signals therefrom to a data input of another one of the groups of flip-flops;
a second multiplexer circuit coupled to an output of a last one of the groups of flip-flops and configured to selectively pass signals therefrom to output the second divided clock signal; and
a feedback circuit having an input coupled to the second multiplexer circuit and an output coupled to a first one of the groups of flip-flops; and
a multiplexer circuit configured to selectively pass the first and second divided clock signals responsive to a third control input.

3. The integrated circuit of claim 2, wherein the groups of flip-flops have different numbers of flip-flops and wherein the first and second multiplexer circuits are controllable to provide variable length flip-flop chains.

4. The integrated circuit of claim 3, wherein, for each group of flip-flops, a first multiplexer circuit is configured to bypass no flip-flops of the group in a first state and to bypass all but one flip-flop of the group in a second state.

5. The integrated circuit of claim 3, wherein the groups of flip-flops and the first and second multiplexer circuits are arranged such that the flip-flop chains do not include any more than one multiplexer circuit between any two consecutive flip-flops.

6. The integrated circuit of claim 2, wherein the feedback circuit is configured to support even and odd integer division.

7. The integrated circuit of claim 6, wherein the feedback circuit comprises:
first and second cascade connected flip-flops, an input of the first flip-flop coupled to an output of the second multiplexer circuit;
a third multiplexer circuit having a first input coupled to an output of the first multiplexer circuit and a second input coupled to a logic level node; and
a NAND circuit having a first input coupled to an output of the third multiplexer circuit, a second input coupled to an output of the second flip-flop and an output coupled to an input of the first one of the groups of flip-flops.

8. The integrated circuit of claim 2, wherein the first variable divider circuit comprises:
a chain of cascade-connected flip-flops; and
a multiplexer circuit configured to selectively couple outputs of the flip-flops of the chain to an input of the chain.

9. The integrated circuit of claim 1, further comprising at least one duty cycle correction circuit coupled to outputs of the first and second variable divider circuits.

10. An integrated circuit comprising:
a first variable divider circuit configured to receive a clock signal and to apply a lower range of integer division factors thereto responsive to a first control input to generate a first divided clock signal;
a second variable divider circuit configured to receive the clock signal and to apply an upper range of integer division factors thereto responsive to a second control input to generate a second divided clock signal; and
a multiplexer circuit configured to selectively pass the first and second divided clock signals responsive to a third control input, wherein the second variable divider circuit provides less inter-flip-flop delay than the first variable divider circuit.

11. The integrated circuit of claim 1, wherein at least one of the first and second variable divider circuits comprises:
a plurality of groups of cascade-connected flip-flops having clock inputs that receive the clock signal;
a plurality of first multiplexer circuits, respective ones of which are coupled to outputs of flip-flops of respective ones of the groups of cascaded flip-flops and configured to selectively pass signals therefrom to a data input of another one of the groups of flip-flops;
a second multiplexer circuit coupled to a last one of the groups of flip-flops and configured to selectively pass signals therefrom to output a divided clock signal; and
a feedback circuit having an input coupled to the second multiplexer circuit and an output coupled to a first one of the groups of flip-flops.

12. The integrated circuit of claim 11, wherein the groups of flip-flops have different numbers of flip-flops and wherein the first and second multiplexer circuits are controllable to provide variable length flip-flop chains.

13. The integrated circuit of claim 12, wherein, for each group of flip-flops, a first multiplexer circuit is configured to bypass no flip-flops of the group in a first state and to bypass all but one flip-flop of the group in a second state.

14. The integrated circuit of claim 12, wherein the groups of flip-flops and the first and second multiplexer circuits are arranged such that the flip-flop chains do not include any more than one multiplexer circuit between any two consecutive flip-flops.

15. The integrated circuit of claim 11, wherein the feedback circuit is configured to support even and odd integer division.

16. The integrated circuit of claim 15, wherein the feedback circuit comprises:
- first and second cascade connected flip-flops, an input of the first flip-flop coupled to an output of the second multiplexer circuit;
- a third multiplexer circuit having a first input coupled to an output of the first multiplexer circuit and a second input coupled to a fixed logic level node; and
- a NAND circuit having a first input coupled to an output of the third multiplexer circuit, a second input coupled to an output of the second flip-flop and an output coupled to an input of a first one of the groups of flip-flops.

17. The integrated circuit of claim 1:
- wherein the first variable divider circuit comprises a series of cascade-connected flip-flops having clock inputs that receive a clock signal and a first multiplexer circuit configured to selectively couple outputs of the flip-flops of the series to an input of the series of flip-flops to generate the first divided clock signal at an output of the series of flip-flops; and
- wherein the second variable divider circuit comprises a plurality of groups of cascade-connected flip-flops having clock inputs that receive the clock signal, a plurality of second multiplexer circuits, respective ones of which are coupled to outputs of flip-flops of respective ones of the groups of cascaded flip-flops and configured to selectively pass signals therefrom to a data input of another one of the groups of flip-flops, a third multiplexer circuit coupled to an outputs of a last one of the groups of flip-flops and configured to selectively pass signals therefrom to produce the second divided clock signal and a feedback circuit having an input coupled to the third multiplexer and an output coupled to a first one of the group of flip-flops.

18. The integrated circuit of claim 17, wherein the first variable divider circuit provides a lower range of division factors and wherein the second variable divider circuit provides an upper range of division factors.

19. The integrated circuit of claim 17, wherein the second variable divider circuit provides less inter-flip-flop delay than the first variable divider circuit.

\* \* \* \* \*